(12) United States Patent
Wang et al.

(10) Patent No.: US 7,833,815 B2
(45) Date of Patent: Nov. 16, 2010

(54) MICROELECTROMECHANICAL SYSTEM PACKAGE AND THE METHOD FOR MANUFACTURING THE SAME

(75) Inventors: Meng Jen Wang, Pintung (TW); Kuo Pin Yang, Meinong Township (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 486 days.

(21) Appl. No.: 12/018,711

(22) Filed: Jan. 23, 2008

(65) Prior Publication Data

US 2008/0303126 A1 Dec. 11, 2008

(30) Foreign Application Priority Data

Jun. 8, 2007 (TW) ............................. 96120669 A

(51) Int. Cl.
  H01L 21/00 (2006.01)
  H01L 23/495 (2006.01)
(52) U.S. Cl. ................... 438/50; 438/52; 257/E29.324; 257/E21.613; 257/676
(58) Field of Classification Search ................... 438/51, 438/50, 52, 113; 257/676, E29.324, E21.613
  See application file for complete search history.

(56) References Cited

U.S. PATENT DOCUMENTS

| | | | | |
|---|---|---|---|---|
| 6,100,107 A * | 8/2000 | Lei et al. ................... | 438/50 |
| 6,773,962 B2 * | 8/2004 | Saia et al. .................. | 438/118 |
| 6,781,231 B2 * | 8/2004 | Minervini ................... | 257/704 |
| 7,443,017 B2 * | 10/2008 | Haluzak et al. .............. | 257/680 |
| 2005/0157374 A1 * | 7/2005 | Tarn ........................... | 359/291 |
| 2008/0042223 A1 * | 2/2008 | Liao et al. ................... | 257/415 |
| 2008/0157236 A1 * | 7/2008 | Chen et al. .................. | 257/415 |
| 2008/0157301 A1 * | 7/2008 | Ramakrishna et al. ...... | 257/676 |
| 2008/0185699 A1 * | 8/2008 | Wang .......................... | 257/676 |
| 2008/0303126 A1 * | 12/2008 | Wang et al. ................. | 257/676 |
| 2009/0289313 A1 * | 11/2009 | Yamazaki ................... | 257/415 |
| 2010/0096713 A1 * | 4/2010 | Jung ........................... | 257/415 |
| 2010/0127339 A1 * | 5/2010 | Laermer et al. ............. | 257/415 |

* cited by examiner

Primary Examiner—Walter L Lindsay, Jr.

(57) ABSTRACT

A method for manufacturing a microelectromechanical system package is provided. A plurality of cavities is first formed on a surface of a silicon wafer. The surface of the silicon wafer is then bonded to the microelectromechanical system wafer in such a manner that the active areas of the chips on the microelectromechanical system wafer are corresponding to the cavities on the silicon wafer. The structure assembly of the two wafers is finally singulated to form individual microelectromechanical system chips whose active areas are covered by the cavities. In this way, the profile of the microelectromechanical system package may be reduced accordingly.

20 Claims, 5 Drawing Sheets

MICROELECTROMECHANICAL SYSTEM PACKAGE AND THE METHOD FOR MANUFACTURING THE SAME

CROSS REFERENCE TO RELATED APPLICATION

This application claims the priority benefit of Taiwan Patent Application Serial Number 096120669 filed Jun. 8, 2007, the full disclosure of which is incorporated herein by reference.

BACKGROUND OF THE INVENTION

1. Field of the Invention

The invention relates to a microelectromechanical system package and the method for manufacturing the same, and more particularly, to a wafer-level micromechanical system package and the method for manufacturing the same.

2. Description of the Related Art

Referring to FIG. 1, a conventional micromechanical system package 100 includes a substrate 110 and a microelectromechanical system (MEMS) device 120, such as a transducer or a silicon-based microphone disposed on the substrate 110. A cover 130 is disposed on the substrate 110 to cover the MEMS device 120. A peripheral edge of the cover 130 is electrically connected to the substrate 110 by a conductive adhesive, solder, or the like 140.

The cover 130 is produced from an outer cup 132a formed from a conductive layer of material such as copper, stainless steel, aluminum, or an alloy thereof. The cover 130 further includes an inner cup 132b. The inner cup 132b is also produced from a conductive layer. An inner lining 150 is formed on the inner cup 132b. The inner lining 150 is primarily formed by conductive material. The inner lining 150 protects the chip 120 from electromagnetic, such as RF interference. The cover 130 has apertures or acoustic ports 160 so that an acoustic signal can pass through the acoustic ports 160 to reach the MEMS device 120. Besides, each acoustic port 160 may contain an environmental barrier layer 170 to prevent water, particles and/or light from entering the package 100 and damaging the internal components inside. The environmental barrier layer 170 is disposed between the outer cup 132a and inner cup 132b and is formed to a film by the micro porous polymeric material typically.

The above-mentioned package 100 has been disclosed in U.S. Pat. No. 6,781,231 and has the advantage of being able to shield the MEMS device 120 therein from external electromagnetic interference and environmental influences. However, the mass production of such packages 100 is difficult. Moreover, the package 100 has a large profile and therefore its application is quite limited.

Accordingly, there exists a need to provide a method for manufacturing a microelectromechanical system package to solve the above-mentioned problems.

SUMMARY OF THE INVENTION

It is an object of the present invention to provide a method for manufacturing microelectromechanical system packages that uses a wafer as a carrier to protect the microelectromechanical system chips in the packages and the thickness of the package can therefore be reduced.

In order to achieve the above object, the method for manufacturing microelectromechanical system packages according to the present invention is first to form a plurality of cavities on a carrier, such as a silicon wafer. A metal layer, an isolation layer and a conductive trace layer are formed on the cavities in sequence. Subsequently, a plurality of microelectromechanical system chips is electrically connected to the conductive trace layer and the active areas of the microelectromechanical system chips are positioned corresponding to the cavities. Finally, the carrier is singulated to form individual microelectromechanical system packages, each of which has at least one of the microelectromechanical system chips.

According to the method of the present invention, the microelectromechanical system chip in the microelectromechanical system package can be protected by a cavity carrier made from a wafer and therefore there is no need to arrange any additional cover to protect the microelectromechanical system chip. Accordingly, the thickness of the microelectromechanical system package can be reduced. Moreover, the metal layer formed on the inside surface of the cavity is able to shield the microelectromechanical system chip from external electromagnetic interference.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENT

Figure 1:
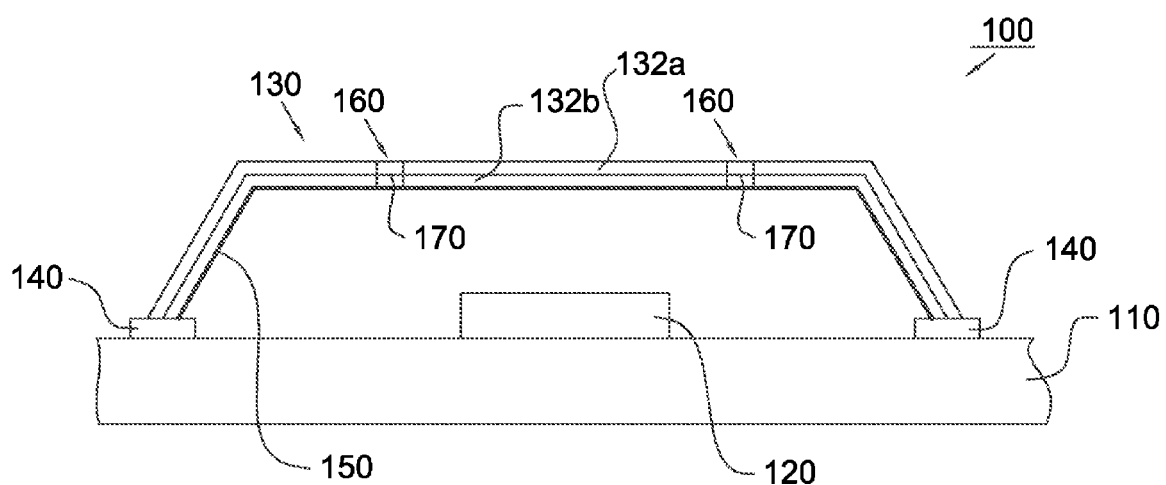
FIG. 1 is a cross-sectional view of a conventional micromechanical system package.

Referring to FIGS. 2a-2g, the method for manufacturing microelectromechanical system (MEMS) packages according to the present invention is first to form a plurality of cavities 220 on the upper surface 212 of a carrier 200, such as a silicon wafer by etching. The each cavity 220 has a central portion 222 surrounded by a peripheral edge portion 224 (see FIG. 2a). A metal layer 230 is then deposited on the upper surface 212 of the carrier 200 and on the cavities 220 (see FIG. 2b). Next, an isolation layer 240 is formed on the metal layer 230. A conductive trace layer 250 and a plurality of bonding pads 262, 264 electrically connected to the conductive trace layer 250 are formed on the isolation layer 240 (see FIG. 2c). Subsequently, a plurality of metal bumps 270 is formed on the bonding pads 264, respectively as terminals for electrically connecting to external devices (see FIG. 2d).

Figure 2A:
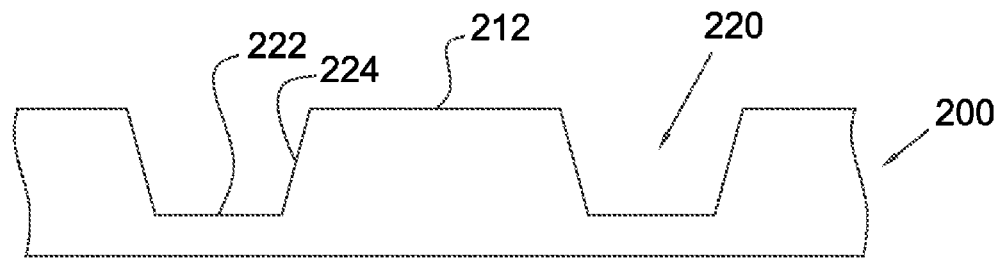
FIGS. 2a to 2g illustrate the method for manufacturing microelectromechanical system packages according to the present invention.
Figure 2B:
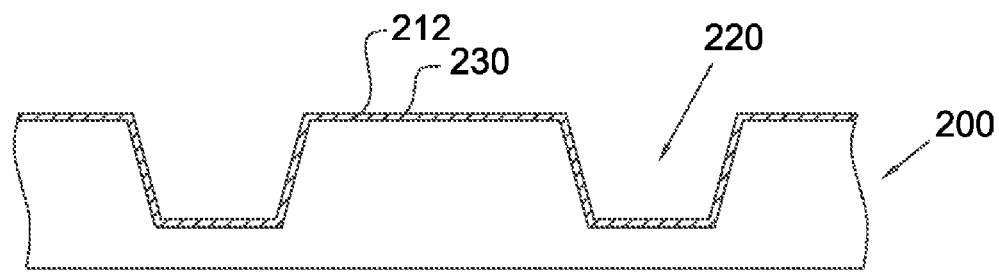
Figure 2C:
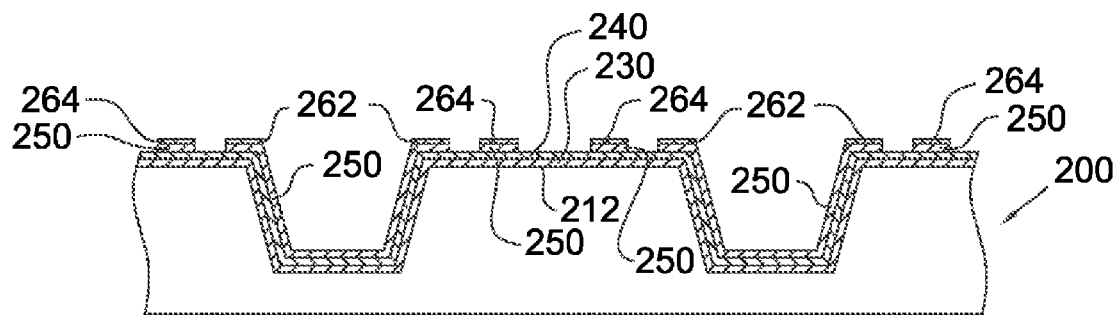
Figure 2D:
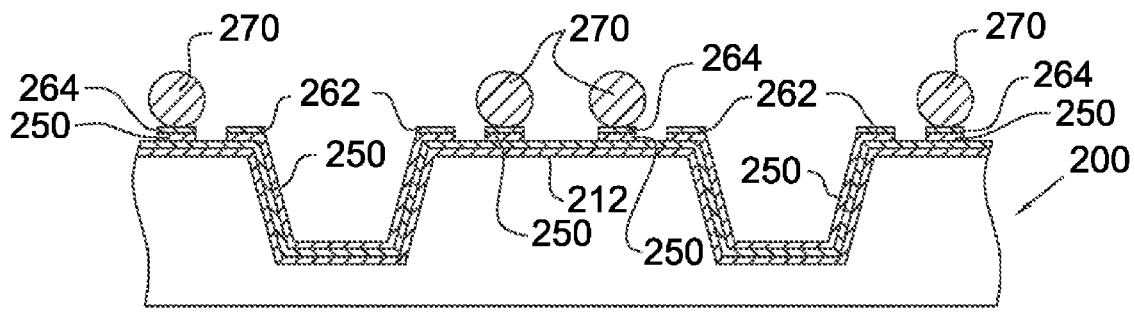
Figure 2E:
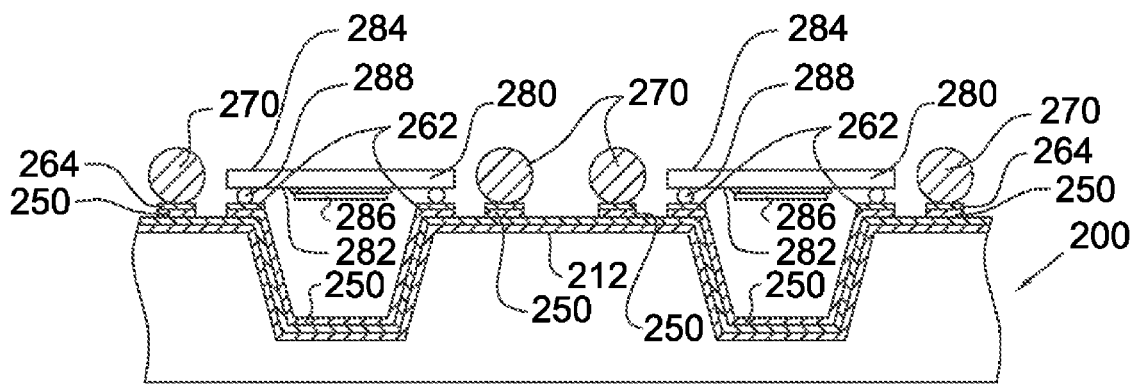

Referring to FIG. 2e, a plurality of MEMS chips 280 are electrically connected to the carrier 200. The MEMS chip 280 has an active surface 282, a back surface 284 opposing to the active surface 282 and an active area 286 positioned on the active surface 282. A plurality of metal bumps 288 is positioned on the edge of the active surface 282 of the each MEMS chip 280. The metal bumps 288 are soldered to the bonding pads 262 by reflow so that the MEMS chips 280 can be electrically connected to the conductive trace layer 250. Besides, since the active areas 286 of the MEMS chips 280 are positioned corresponding to the cavities 220 of the carrier 200, respectively, the active areas 286 of the MEMS chips 280 can therefore be protected by the carrier 200.

Figure 2F:
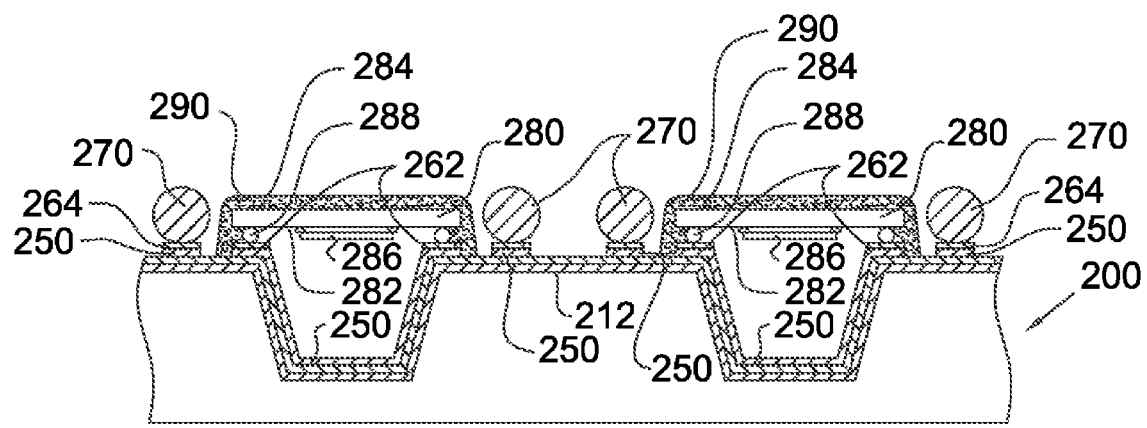
Figure 2G:
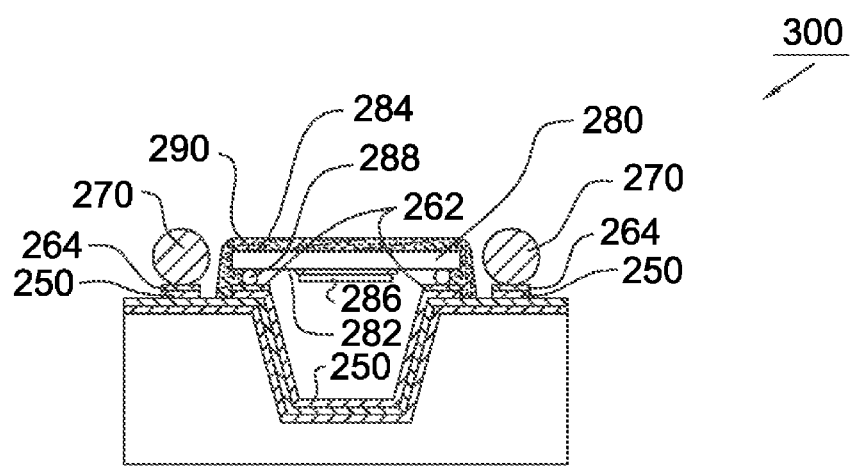

Referring to FIG. 2f, in order to protect the MEMS chips 280 and metal bumps 288, sealants 290 can be formed to encapsulate these components. Next, referring to FIG. 2g, the structure assembly of the carrier 200 and MEMS chips 280 is singulated to form individual MEMS packages 300, wherein each of the MEMS packages 300 includes at least one of the MEMS chips 280.

The MEMS package 300 has a metal layer 230 on the inner surface of the cavity 220 and therefore the MEMS chip 280 inside the MEMS package 300 can be shielded from the external electromagnetic interference. Moreover, the isolation layer 240 is to electrically isolate the metal layer 230 from the conductive trace layer 250.

Figure 3:
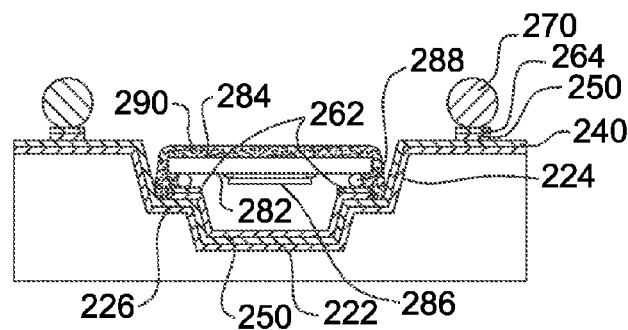
FIG. 3 is a cross-sectional view of another aspect of the microelectromechanical system package of the present invention.

Referring to FIG. 3, it illustrates another aspect of the MEMS package 300 of the present invention. The cavity 220 of the carrier 200 has a step shape. Specifically, the cavity 220 has an annular platform 226 between the central portion 222 and peripheral edge portion 224 of the cavity 220. The bonding pads 262 are positioned on the annular platform 226 of the cavity 220. The metal bumps 288 of the MEMS chip 280 are bonded to the bonding pads 262 on the annular platform 226. In this way, a smaller MEMS chip 280 can be used and therefore the profile of the MEMS package 300 can be further reduced.

Figure 4A:
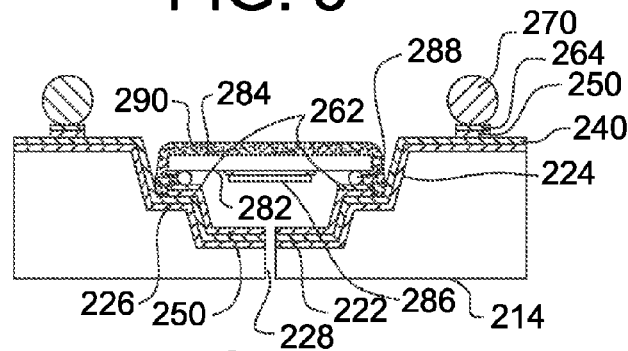
FIGS. 4a and 4b illustrate the microelectromechanical system package of FIG. 3, wherein the packages of FIGS. 4a and 4b further include openings extending from the cavities to the outside of the microelectromechanical system packages.
Figure 4B:
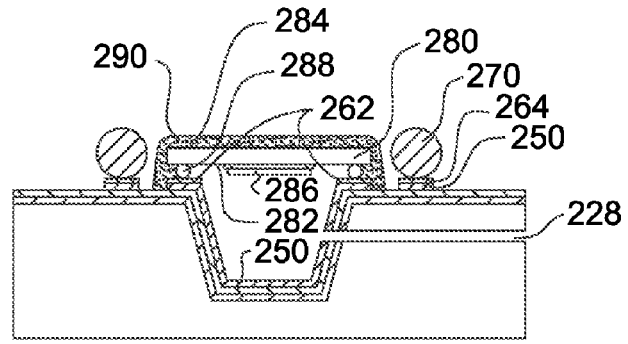

Referring to FIGS. 4a and 4b, when the MEMS chip 280 is a microphone chip, it is required to arrange acoustic ports for the MEMS package 300 so that the microphone chip 280 inside the package 300 can receive an external acoustic signal. Therefore, an opening 228 is formed through the cavity 220 of the carrier 200 to the outside of the package 300. For example, the opening 228 extends from the central portion 222 of the cavity 220 to the lower surface 214 of the carrier 200 (see FIG. 4a). Alternatively, the opening 228 can extend from the peripheral edge portion 224 of the cavity 220 to the outside of the package 300 (see FIG. 4b). In this way, the microphone chip 280 can receive an acoustic signal from the outside of the package 300 through the opening 228.

Figure 5:
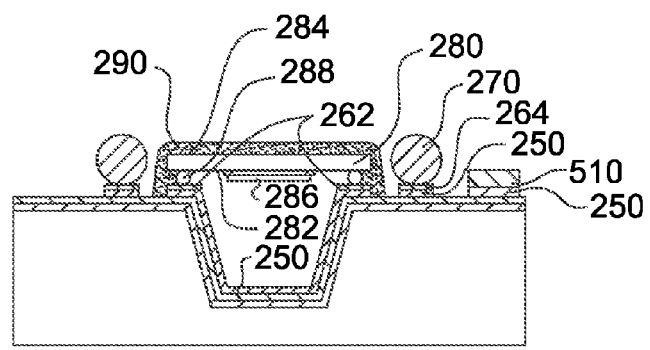
FIG. 5 illustrates the microelectromechanical system package of FIG. 2g, wherein the package of FIG. 5 further includes other chips.

Furthermore, in addition to the MEMS chip 280, the MEMS package 300 of the present invention can include other chips to enhance the function of the MEMS package 300. For example, chips 510, such as other MEMS chips or application specific integrated circuit (ASIC) chips can be arranged on the upper surface 212 of the carrier 200 and electrically connected to the conductive trace layer 250. FIG. 5 illustrates the MEMS package 300 with the chip 510 that is singulated from the carrier 200.

According to the method of the present invention, the MEMS chip in the MEMS package can be protected by a cavity of the carrier made from a wafer, the thickness of the MEMS package can therefore be reduced. Moreover, the metal layer formed on the inside surface of the cavity is able to shield the MEMS chip from external electromagnetic interference and therefore enhance the function of the MEMS package.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing a microelectromechanical system package, comprising the steps of:
   providing a carrier with opposing first and second surfaces;
   forming a plurality of cavities on the first surface of the carrier, the each cavity having a central portion and a peripheral edge portion surrounding the central portion;
   forming a metal layer on the cavities and the first surface of the carrier;
   forming an isolation layer on the metal layer;
   forming a conductive trace layer on the isolation layer;
   electrically connecting a plurality of first microelectromechanical system chips to the conductive trace layer, the each first microelectromechanical system chip having an active surface, a back surface opposing to the active surface and an active area positioned on the active surface, wherein the active areas of the first microelectromechanical system chips are positioned corresponding to the cavities, respectively; and
   singulating the carrier to form individual microelectromechanical system packages, wherein the each microelectromechanical system package has at least one of the first microelectromechanical system chips.

2. The method as claimed in claim 1, further comprising:
   forming a plurality of bonding pads on the isolation layer and electrically connecting the bonding pads to the conductive trace layer; and
   forming a plurality of metal bumps on the active surfaces of the first microelectromechanical system chips and electrically connecting the metal bumps to the bonding pads.

3. The method as claimed in claim 2, further comprising:
   forming sealants to encapsulate the metal bumps.

4. The method as claimed in claim 1, wherein the first microelectromechanical system chips are microphone chips.

5. The method as claimed in claim 2, wherein the each cavity has an annular platform between the central portion and the peripheral edge portion, the bonding pads are positioned on the annular platforms.

6. The method as claimed in claim 4, further comprising:
   forming a plurality of openings through the cavities to the second surface of the carrier.

7. The method as claimed in claim 1, further comprising:
   positioning a plurality of second chips on the first surface of the carrier and electrically connecting the second chips to the conductive trace layer, wherein the each microelectromechanical system package singulated from the carrier has at least one of the second chips.

8. The method as claimed in claim 1, wherein the carrier is a wafer.

9. A microelectromechanical system package, comprising:
   a carrier, comprising:
      opposing first and second surfaces, the first surface having a cavity, the cavity having a central portion and a peripheral edge portion surrounding the central portion;
      a metal layer formed on the cavity and the first surface;
      an isolation layer formed on the metal layer; and
      a conductive trace layer formed on the isolation layer; and
   a first microelectromechanical system chip electrically connected to the conductive trace layer, the first microelectromechanical system chip having an active surface, a back surface opposing to the active surface and an active area positioned on the active surface, wherein the active area of first the microelectromechanical system chip is positioned corresponding to the cavity of the carrier.

10. The microelectromechanical system package as claimed in claim 9, further comprising:
- a plurality of bonding pads formed on the isolation layer and electrically connected to the conductive trace layer; and
- a plurality of metal bumps formed on the active surface of the first microelectromechanical system chip and electrically connected to the bonding pads.

11. The microelectromechanical system package as claimed in claim 10, further comprising:
- a sealant encapsulating the metal bumps.

12. The microelectromechanical system package as claimed in claim 9, wherein the first microelectromechanical system chip is a microphone chip.

13. The microelectromechanical system package as claimed in claim 10, wherein the cavity has an annular platform between the central portion and peripheral edge portion, the bonding pads are positioned on the annular platform.

14. The microelectromechanical system package as claimed in claim 12, wherein the carrier has an opening extending from the cavity to the outside of the microelectromechanical system package.

15. The microelectromechanical system package as claimed in claim 14, wherein the opening extends from the cavity to the second surface of the carrier.

16. The microelectromechanical system package as claimed in claim 14, wherein the opening extends from the peripheral edge portion of the cavity to the outside of the microelectromechanical system package.

17. The microelectromechanical system package as claimed in claim 9, further comprising:
- a second chip positioned on the first surface of the carrier and electrically connected to the conductive trace layer.

18. The microelectromechanical system package as claimed in claim 17, wherein the second chip is a microelectromechanical system chip.

19. The microelectromechanical system package as claimed in claim 17, wherein the second chip is an application specific integrated circuit chip.

20. The microelectromechanical system package as claimed in claim 9, wherein the carrier is made of silicon.

* * * * *